(12) United States Patent
Rahim et al.

(10) Patent No.: US 10,964,705 B2
(45) Date of Patent: Mar. 30, 2021

(54) METHOD OF FORMING A SEMICONDUCTOR DEVICE

(71) Applicant: SEMICONDUCTOR COMPONENTS INDUSTRIES, LLC, Phoenix, AZ (US)

(72) Inventors: Irfan Rahim, Milpitas, CA (US); Raminda Madurawe, Sunnyvale, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/126,877

(22) Filed: Sep. 10, 2018

(65) Prior Publication Data

US 2020/0083231 A1 Mar. 12, 2020

(51) Int. Cl.
*H01L 27/00* (2006.01)
*H01L 27/11* (2006.01)

(52) U.S. Cl.
CPC ...... *H01L 27/1104* (2013.01); *H01L 27/1116* (2013.01)

(58) Field of Classification Search
CPC .................. H01L 27/0207; H01L 27/1104
See application file for complete search history.

(56) References Cited

U.S. PATENT DOCUMENTS

| | | | | |
|---|---|---|---|---|
| 5,466,961 A * | 11/1995 | Kikuchi | ............... | H01L 27/115 257/329 |
| 6,331,873 B1 * | 12/2001 | Burke | ............... | H01L 27/14887 257/223 |
| 2011/0235407 A1 * | 9/2011 | Lim | ............... | H01L 27/11 365/156 |
| 2013/0258759 A1 * | 10/2013 | Liaw | ............... | G11C 11/412 365/154 |
| 2015/0129881 A1 * | 5/2015 | Kong | ............... | H01L 27/1248 257/72 |
| 2015/0279780 A1 * | 10/2015 | Zhang | ............... | H01L 21/7681 257/774 |
| 2017/0141029 A1 * | 5/2017 | Guo | ............... | H01L 23/5226 |

OTHER PUBLICATIONS

Victor H. Champac et al., "IDDQ Testing of Opens in CMOS SRAMs," Journal of Electronic Testing, Aug. 1999, vol. 15, Issue 102, pp. 53-62.

\* cited by examiner

*Primary Examiner* — Mounir S Amer
*Assistant Examiner* — Alexander Belousov
(74) *Attorney, Agent, or Firm* — Robert F. Hightower

(57) ABSTRACT

In one embodiment, a method of forming a semiconductor device may include extending a gate conductor of a transistor to overlie a boundary of a well region in which the transistor is formed. The gate conductor may extend to make electrical contact with a gate conductor of a 2nd transistor that is formed external to the well region. A contact conductor may be applied to electrically and physically contact the first and 2nd gate conductors and to also overlie the boundary of the well region.

13 Claims, 3 Drawing Sheets

METHOD OF FORMING A SEMICONDUCTOR DEVICE

BACKGROUND OF THE INVENTION

The present invention relates, in general, to electronics, and more particularly, to semiconductors, structures thereof, and methods of forming semiconductor devices.

In the past, the semiconductor industry utilized various methods and structures to form static random access memories (SRAMs). One common type of SRAM cell utilized six interconnected transistors and is often referred to as a 6T SRAM cell. Under some circumstances, a gate connection of one of the transistors of the 6T SRAM cell could be disconnected and the disconnection could not be detected during normal and initial testing of the memory that included the defective cell. This type of defect often was only detected after the memory had been in use for a longer period of time. Such defects often resulted in time-consuming and expensive product returns and replacements.

Accordingly, it is desirable to have an SRAM cell that minimizes such defects.

Figure 1:
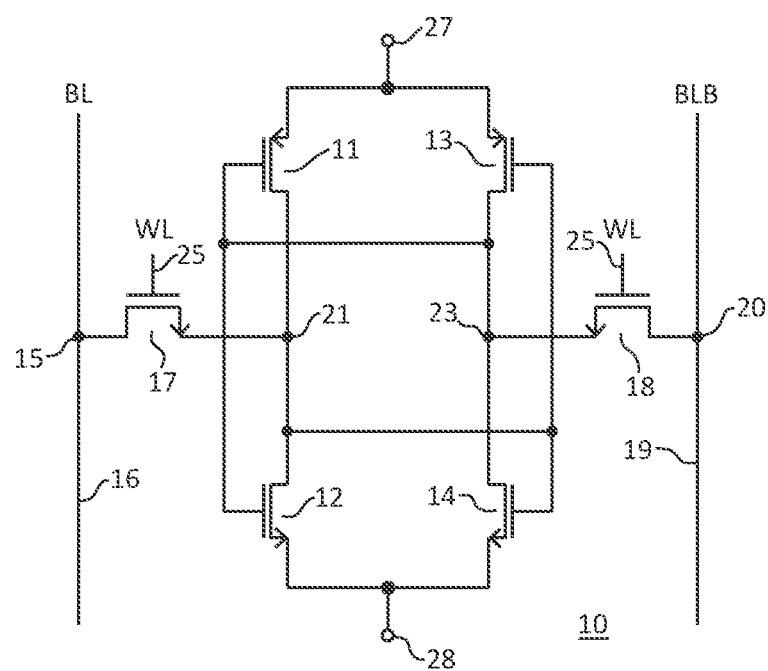
FIG. 1 schematically illustrates a portion of an embodiment of a 6T SRAM circuit in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

The embodiments illustrated and described hereinafter suitably may have embodiments and/or may be practiced in the absence of any element which is not specifically disclosed herein.

DETAILED DESCRIPTION OF THE DRAWINGS

FIG. 1 schematically illustrates a portion of an embodiment of a 6T SRAM circuit 10 that assists in reducing faults. For example, faults resulting from an open connection to a gate of one of the transistors of circuit 10. Circuit 10 includes storage nodes 21 and 23 that are utilized to store a value that is assigned to circuit 10. A P-channel transistor 11 and an N-channel transistor 12 that each have drains connected to node 21. A P-channel transistor 13 and an N-channel transistor 14 of circuit 10 each have drains connected to a node 23. An N-channel access transistor 17 has a source connected to node 21, and an N-channel access transistor 18 has a source connected to node 23. A drain of transistor 17 is connected to a bit line (BL) conductor 16 at a node 15, and a drain of transistor 18 is connected to a bit line bar (BLB) conductor 19 at a node 20. Those skilled in the art will appreciate that in order to store a bit of information within circuit 10, bit line (BL) conductor 16 and bit line bar (BLB) conductor 19 are driven to opposite states and transistors 17 and 18 are enabled via a word line (WL) conductor 25 so that nodes 21 and 23 are driven to opposite states. Transistors 17 and 18 are then disabled and the states stored on nodes 21 and 23 are maintained by respective transistor pairs 11-12 and 13-14. In order to assist in maintaining the storage states, a gate of transistor 11 is commonly connected to a gate of transistor 12 and to node 23. Additionally, a gate of transistor 13 is commonly connected to a gate of transistor 14 and to node 21. Those skilled in the art will understand that the source and drain of a transistor, including transistors 17 and 18, can be reversed depending on which one receives the high and low voltages. Thus, for clarity of the explanation, the source of transistors 17 and 18 is referred to herein as the electrode that is connected to respective nodes 21 and 23.

After the information or data is stored in circuit 10, one of nodes 21 or 23 will be at an asserted logic state and the other will be at a negated logic state. For the one of nodes 21 and 23 that has been written to a state represented by a higher voltage than the other of nodes 21 and 23, the corresponding one of transistors 11 or 13 maintains that higher voltage while the opposite one of transistors 12 and 14 maintains the opposite one of nodes 21 and 23 at the lower voltage. Assume for example that node 21 is written to the state requiring the higher voltage, thus, transistor 11 maintains the voltage at node 21 after transistor 17 is disabled.

In prior SRAM cells, one possible method to read a cell was to pre-charge the bit line conductors to a high level, and then monitor the conductors and determine which conductor drops in voltage. While doing such a read operation, if the connection to the gate of the P-channel transistor were missing, it was possible that the storage node that was written to the higher voltage could be maintained at the higher voltage for a period of time even if the P-channel transistor gate is disconnected. In most cases, such a condition resulted in the P-channel transistor being turned-off. During testing of such a prior SRAM cell, the cell may not show as defective because it may take a long period of time for the voltage stored at the storage node to decrease to a value that was less than the stored value. Therefore, during testing it was difficult to detect such a defect in the prior SRAM cell. Those skilled in the art will appreciate that such a condition could also occur with the N-channel transistor if a low voltage were used to pre-charge conductors 16 and 19 instead of a high voltage.

However, the structure of circuit 10 reduces the possibility of an open circuit to the gate of either of transistors 11 or 13 as will be seen further hereinafter.

Figure 2:
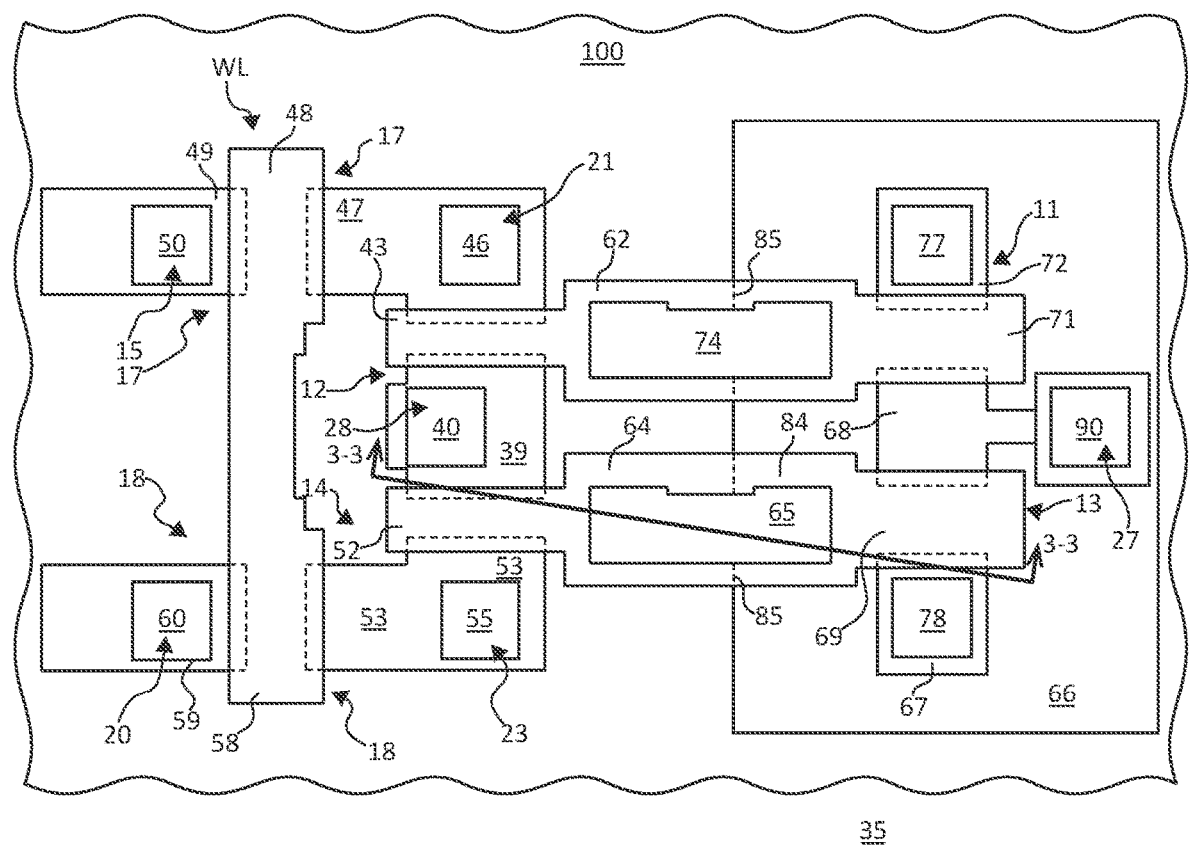
FIG. 2 illustrates an enlarged plan view of a portion of an example of an embodiment of a semiconductor device that includes at least a portion of the circuit of FIG. 1 in accordance with the present invention.

FIG. 2 illustrates an enlarged plan view of a portion of an example of an embodiment of a semiconductor device 35. An example of an example of at least a portion of an embodiment of circuit 10 is formed on device 35.

Figure 3:
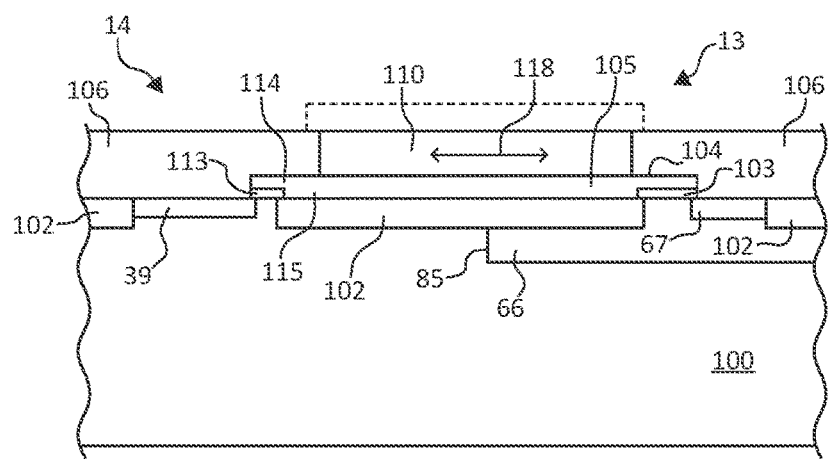
FIG. 3 illustrates an enlarged cross-sectional view of a portion of the semiconductor device of FIG. 2 in accordance with the present invention.

FIG. 3 illustrates an enlarged cross-sectional view of a portion of device 35 along cross-sectional line 3-3 illustrated in FIG. 2. This description has references to FIGS. 1-3.

An embodiment of device 35 may be formed on a semiconductor substrate 100. Substrate 100 may have an embodiment in which substrate 100 is a silicon semiconductor substrate. Substrate 100 may have an embodiment that may be formed as a P-type substrate. Another embodiment may include that substrate 100 may be formed to include an underlying bulk silicon substrate that has a doped region formed therein as substrate 100. A doped region of an opposite conductivity type may be formed on substrate 100 to form a well region or doped region 66. Region 66 may be utilized for forming P-type transistors 11 and 13. In an embodiment, region 66 may be N-type. A periphery of region 66 abuts an adjacent portion of substrate 100 along a boundary 85 of region 66. For clarity of the description and as used herein, boundary 85 is a portion of the edge of the outer periphery of region 66 that extends from the surface of substrate 100 into substrate 100 and that abuts substrate 100 along a portion of region 66 that underlies portions of transistors 11 and 13. An embodiment of boundary 85 extends at an angle of between substantially eighty to substantially one hundred ten degrees from the surface of substrate 100 into substrate 100.

An embodiment of transistors 12, 14, and 17-18 may be formed in a portion of substrate 100 that is external to region 66. In some embodiments, doped regions 39, 47, and 53 are formed in substrate 100 to form the active region of transistors 12 and 14. The active region may also include a channel region. Doped regions 39, 47, and 53 may have an embodiment that may have the same conductivity type as substrate 100 but a different doping concentration, such as for example a higher doping concentration. Region 39 may have an embodiment that forms the source of transistors 12 and 14. Regions 47 and 53 may have embodiments that may be formed as the drain of respective transistors 12 and 14. An embodiment of regions 47 and 53 may be also form the source of respective transistors 17 and 18. Gate structures 43 and 52 may be formed overlying a portion of substrate 100 that is between respective regions 39 and 47, and regions 39 and 53. A channel region for transistors 12 and 14 may be formed in part of this portion of substrate 100. Those skilled in the art will appreciate that a small portion of doped regions 39, 47, and 53 may underlie the outside edges of the gate structures as illustrated by the dashed line portion of regions 39, 47, and 53. A contact via structure 40 may be formed in region 39. Structure 40 may be formed to electrically connect to region 39 to provide an electrical connection to the sources of transistors 12 and 14.

Structure 40 is connected to terminal 28 by conductor interconnects that are not shown in FIG. 2. Contact via structures 46 and 55 may be formed in respective regions 47 and 53 to electrically connect thereto and to provide an electrical connection to the drain of respective transistors 12 and 14.

Doped regions 49 and 59 may also be formed in substrate 100 and external to region 66 to function as the drain region of respective transistors 17 and 18. Doped region 49 may be formed near to region 47 but spaced a distance apart sufficient for forming a channel region for transistor 17. Similarly, doped region 59 may be formed near to region 53 but spaced a distance apart sufficient for forming a channel region for transistor 18. Gate structures for transistors 17-18 may be formed to overlie a portion of substrate 100 that is positioned between respective regions 47 and 49, and regions 53 and 59. A gate structure 48 for transistor 17 may be formed overlying a portion of substrate 100 that is between regions 47 and 49 so that a portion of substrate 100 becomes the channel of transistor 17. Similarly, a gate structure 58 for transistor 18 may be formed overlying a portion of substrate 100 that is between regions 53 and 59. Those skilled in the art will appreciate that a small portion of doped regions 47, 49, 53, and 59 may underlie the outside edges of structures 48 and 58 as illustrated by the dashed line portion of regions 47, 49, 53, and 59. Gate structures 48 and 58 may be interconnected together. Structures 48 and 58 may also be electrically connected to word line (WL) 25 by a conductor not shown in FIG. 2. Connector via structures 50 and 60 may be formed in respective regions 49 and 59 to facilitate forming an electrical connection to the drain of respective transistors 17 and 18. Structures 50 and 60 may be electrically connected to respective BL and BLB by electrical conductors that are not shown in FIG. 2.

Transistors 11 and 13 may have an embodiment that may be formed in region 66. Doped regions 67-68 and 72 may be formed within region 66 with a conductivity type that is opposite to that of region 66 to form the source and drain of transistors 11 and 13. In an embodiment, doped regions 67 and 72 may be formed as P-type doped regions within region 66 to form the drain of respective transistors 13 and 11, and doped region 68 may be formed as a P-type doped region to form the source of transistors 11 and 13. An embodiment of regions 67-68 and 72 may form a portion of an active region of transistors 11 and 13. Because portions of region 68 may be used as the source of both transistors 11 and 13, region 68 forms a connection between the sources of transistors 11 and 13. Other embodiments of transistors 11 and 13 may have separate source regions. An embodiment of region 68 may be formed to extend to intersect with a contact via structure 90 which may be connected to terminal 27 by conductor interconnects that are not shown in FIGS. 2-3. Structure 90 may include a source contact conductor within structure 90. Contact via structures 77 and 78 may be formed in respective regions 72 and 67 to electrically connect thereto and to provide an electrical connection to the drain of respective transistors 11 and 13. Structures 77 and 78 may also be electrically connected to respective nodes 21 and 23 and to the drain of respective transistors 12 and 14, such as for example to respective structures 46 and 55, by conductor interconnects that are not shown in FIG. 2.

Gate structures for transistors 11 and 13 may be formed to overlie a portion of region 66. An embodiment of the gate structures may be formed to overlie a portion of region 66 that is positioned between regions 67-68 and between region 68 and 72. Those skilled in the art will appreciate that a small portion of doped regions 67-68 and 72 may underlie the outside edges of the gate structures as illustrated by the dashed line portion of regions 67-68 and 72. A gate structure 69 for transistor 13 may be formed overlying a portion of region 66 that is between regions 67-68 so that a portion of region 68 becomes the drain of transistor 13 and region 67 becomes the source of transistor 13. Similarly, a gate structure 71 for transistor 11 may be formed overlying a portion of region 66 that is between regions 68 and 72 so that a portion of region 68 becomes the drain of transistor 11 and region 72 becomes the source of transistor 11.

Gate structures 69 and 71 may be formed to extend to intersect respective gate structures 52 and 43 to form an electrical connection between the gate conductors of gate structures 71 and 43, and an electrical connection between the gate conductors of gate structures 69 and 52. The formation of transistors 11-14, and in some embodiments transistors 17-18, may include forming an insulator 102 (FIG. 3) to insulate the semiconductor regions, such as for example active and non-active regions of transistors 11-14, from conductors and semiconductor materials that may be formed overlying the surface of substrate 100. In some embodiments, insulator 102 may be referred to as a field oxide. An embodiment may include that insulator 102 is formed as a shallow trench isolation (STI) that is formed by methods that are well-known to those skilled in the art. In other embodiments, insulator 102 may be formed by other techniques such as for example formed by a LOCOS or other well-known method. Insulator 102 may be formed from silicon dioxide or silicon nitride or silicon-oxy-nitride or other well-known insulator materials. Gate structure 69 may include a gate insulator 103 (FIG. 3) overlying the channel region of transistor 13 that is disposed between regions 67 and 68. Insulator 103 may be formed from silicon dioxide or silicon nitride or other well-known insulator materials there are suitable for forming a gate insulator. The forming of structure 69 may also include forming a gate conductor 104 to overlie the channel region. Conductor 104 may have an embodiment that may be formed on insulator 103. Those skilled in the art will appreciate that the material of conductor 104 may also extend, as a conductor 105, to overlie portions of insulator 102 that are adjacent to the channel region. In some embodiments, these adjacent portions of insulator 102 may also be part of gate structure 69. An embodiment of conductors 104 and 105 are formed as P-type polysilicon. In the preferred embodiment, conductors 104 and 105 do not include substantially any silicide or salicite material and are substantially only doped polysilicon. An embodiment of conductor 105, or alternately conductor 104, extends laterally, for example substantially perpendicular to the current flow direction of transistor 13, toward gate structure 52. A channel region for transistor 13 may be formed in part region 66 that underlies conductor 104.

Gate structure 52 of transistor 14 may be formed to include a gate insulator 113 and a gate conductor 114. A channel region for transistor 14 may be formed in part substrate 100 that underlies conductor 114. Insulator 113 may be formed to overlie the channel region of transistor 14 that is disposed between regions 39 and 53. Insulator 113 may be formed from the same material as insulator 103. An embodiment of insulators 103 and 113 has a thickness that is approximately one to two orders of magnitude thinner than insulator 102. Some embodiments of insulators 103 and 113 may have a thickness that is approximately ten to approximately thirty (10-30) Angstroms and insulator 102 may have a thickness of approximately three thousand or more Angstroms (3000). A gate conductor 114 of structure 52 may also be formed to overlie the channel region. An embodiment of conductor 114 may be formed on insulator 113. It should be noted that because of the angle of cross-section line 3-3, only portions of insulators 103 and 113 and conductors 104 and 114 are shown in FIG. 3. Those skilled in the art will appreciate that the material of conductor 114 may extend, as a conductor 115, to also overlie portions of insulator 102 that are adjacent to the channel region. In some embodiments, these adjacent portions of insulator 102 may also be part of structure 52. An embodiment of conductors 114 and 115 is formed as N-type polysilicon. In the preferred embodiment, conductors 114 and 115 do not include any silicide or salacide material and are substantially only doped polysilicon. An embodiment of conductor 115, or alternately conductor 114, extends laterally toward structure 69. An embodiment may extend laterally, such as for example substantially perpendicular to the current flow direction of transistor 14. Conductor 115, or alternately conductor 114, may have an embodiment that extends overlying insulator 102 to abut and form an electrical connection to conductor 105, or alternately conductor 104. In an embodiment, this electrical connection may be a direct electrical connection. Conductor 115, or alternately conductor 105, may have an embodiment that may extend to substantially overlie boundary 85. In another example embodiment, conductor 115, or alternately conductor 105, may extend past boundary 85 and abut and form an electrical connection to conductor 105, or alternately conductor 104. In another example embodiment, conductor 105, or alternately conductor 104, may extend past boundary 85 and abut and form an electrical connection to conductor 115, or alternately conductor 105. Another embodiment may include that conductor 105, or alternately conductor 104, may be formed to extend to overlie but not to extend past boundary 85, and conductor 115, or alternately conductor 114, may be formed to extend to overlie but not to extend past boundary 85 and abut and form an electrical connection between conductors 105 and 115, or alternately between conductors 104 and 114. Those skilled in the art will understand that a method of forming transistors 11-14 may include forming conductors 104-105 and 114-115 by forming a layer of polysilicon on insulators 102-103 and 113, patterning the polysilicon, and then doping a first portion P-type to form conductors 104-105 and doping a second portion N-type to form conductors 114-115. Thus, the interface or connection between conductors 105 and 115 may be anywhere near the region indicated by an arrow 118. Those skilled in the art understand that a P-N junction is formed at the interface of conductors 105 and 115.

An embodiment of gate structures 52 and 69 may include contact via structure 65. Structure 65 may have an embodiment that may be formed in both structures 52 and 69. For example, an insulator 106 may be formed overlying region 66, and other portions of transistors 11-14. An embodiment of forming insulator 106 may including forming insulator 106 on portions of insulator 102, conductors 104-105, and conductors 114-115. An opening may be formed in insulator 106 such that the opening overlies portions of conductors 105 and 115 and extends across boundary 85. A conductor material may be formed in the opening to form a gate contact conductor 110 within the opening to form an electrical connection to both conductors 105 and 115, thus to conductors 104 and 114. Those skilled in the art will appreciate that the material of conductor 110 may be a composite of conductor materials, such as for example a composite of titanium, nickel, and tungsten. The material of conductor 110 may then be substantially planarized, such as by CMP or other planarization methods, to remove portions of the material that extend above the surface of insulator 106, such as the material illustrated by the dashed line of conductor 110. The opening for conductor 110 and the resulting conductor 110 is formed to overly boundary 85 and to make direct physical contact and form an electrical connection conductors 105 and 115, thus to conductors 104 and 114.

The size of structure 65 is larger than the size of structures 77, 78, 46, and 55. For example, the length of conductor 110 in the direction between transistors 13 and 14 is greater than the width or length of any of structures 77, 78, 46, and 55. In an embodiment, the length of conductor 110 is longer than a width of conductor 110. In an embodiment, the length of conductor 110 as it extends toward conductors 104 and 114, is approximately three to four (3-4) times the width of conductor 110 and also approximately three to four (3-4) times the width or the length of any of structures 40, 46, 55, 78, 77, or 90. The increased length of conductor 110 also assists in providing an electrical connection between conductors 104 and 114 which assists in reducing the possibility of an open circuit to the gate of transistor 11, and also the similar configuration of structure 74 and the conductor therewith.

Those skilled in the art will also appreciate that structures 43 and 71 along with structure 74 may be formed similarly to respective structures 52 and 69 and structure 65.

It has been found that forming conductors 105 and 115 to extend and make an electrical connection between the two conductors assists in reducing the possibility of an open circuit to the gate of transistor 11, and also the similar configuration of structures 43 and 71 provide the same improvement of transistor 13. Additionally, forming conductor 110 to overly boundary 85 and form an electrical connection to both conductors 105 and 115 provides an additional electrical connection to the gate of transistor 13 and also assists in reducing the possibility of an open circuit to the gate of transistor 13. Forming conductor 110 to contact the portion of conductors 105 and 115 at the interface of conductors 105 and 115 forms a short across the P-N junction that allows current to flow in both directions through conductors 105 and 115. The similar configuration of structure 74 and the conductor associated therewith provides the same improvement for transistor 11.

In the past, it was thought that extending the gate conductor to overlie the boundary between the doped region and the substrate would result in forming an additional P-N junction that might cause improper operation of the transistors.

However, the structure, such as for example forming conductor 110 on the portion of conductors 105 and 115 that overlie boundary 85 forms a short across any such diode and provides proper operation of the transistors which provides an unexpected result of providing proper operation even though the conductors are doped. Those skilled in the art will appreciate that even if some small amount of silicide is included in conductors 105 and 115, as long as conductor 110 still directly contacts a P-N junction that is formed by the material of conductors 105 and 115 at the interface thereof, then conductor 110 still provides the advantages explained herein.

Those skilled in the art will appreciate that the structure of transistors 13 and 14, and/or transistors 11 and 12, may be utilized in other devices in addition to being used in an SRAM cell. Additionally, those skilled in the art will appreciate that a 6T SRAM cell may have other layout configurations as long as conductor 110 directly contacts conductors 105 and 115 and contacts the P-N junction formed at the interface of conductors 105 and 115. An embodiment may also include that conductor 110 overlies boundary 85.

Figure 4:
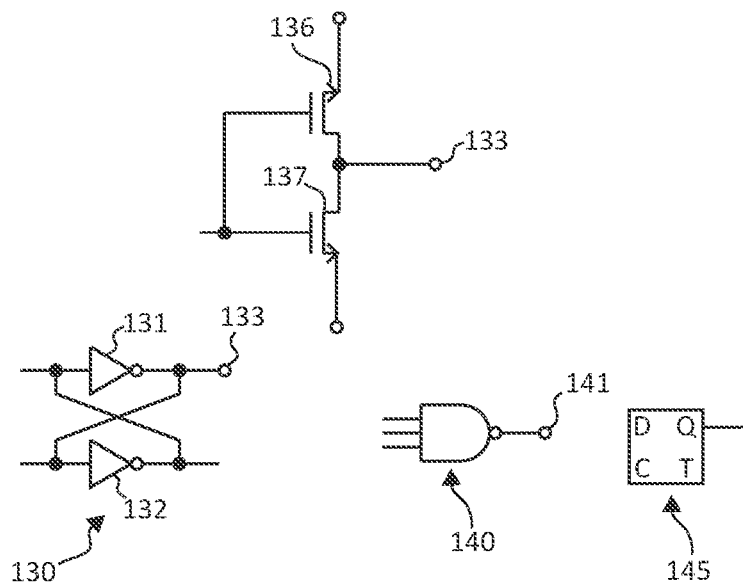
FIG. 4 illustrates various other circuits that may utilize the structure of the device of FIGS. 1-3 in accordance with the present invention.

FIG. 4 illustrates various other circuits that may utilize the structure of transistors 13 and 14. A cross couple latch 130 utilizes inverters 131 and 132 and a cross coupled configuration that includes an output 133. FIG. 4 also illustrates transistors 136 and 137 that could have an embodiment that may be an alternate embodiment of transistors 13 and 14. Transistors 136 and 137 to be either of inverters 131 or 132.

A NAND gate 140 illustrated in FIG. 4 also has an output structure that may utilize transistors 136 and 137 to form an output 141. In an embodiment, transistors 136 and 137 to be the output structure of gate 140 where output 133 of transistors 136 and 137 would be the same is output 141. Additionally, a D flip-flop 145. A Q output that is formed using transistors 136 and 137 where output 133 of transistors 136 137 would be Q output of flip-flop 145.

Figure 5:
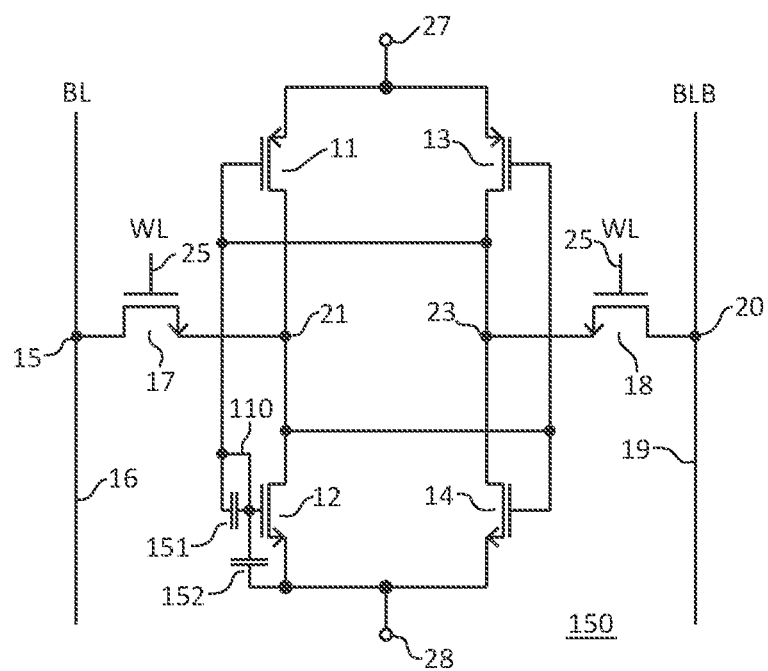
FIG. 5 schematically illustrates an example of a portion of an embodiment of a circuit that may be formed as a result of missing portions of an insulator in accordance with the present invention.

FIG. 5 schematically illustrates an example of a portion of an embodiment of a circuit 150 that may be formed as a result of missing portions of an insulator. During the process of manufacturing device 35, it may be possible that portions of some of the insulators may be removed. For example, during a CMP operation portions of insulator 106 may unintentionally be removed such that the thickness of the insulator may be decreased in some regions. Such missing portions of insulator could result in a lower quality insulator which could reduce the reliability of a device that includes such an insulator. It has been found that an unexpected result of contact structures 65 and 74 is that the structures provide redundant electrical connection between the gate conductors of the transistors which provides a mechanism to detect issues with the insulators.

In some embodiments, the missing insulator may cause a poor connection to the gate conductor of a transistor. This poor connection may result in a capacitive coupling to a gate conductor such as for example as illustrated by capacitors 151 and 152. However, because of the redundant connection to the gate formed by conductor 110, a voltage still can be applied to the gate of transistor 12 and bypass the capacitive coupling of capacitors 151 and 152. Therefore, if a high voltage is applied to the gates of transistors 11 and 12, such as for example at node 23, the high voltage causes a breakdown of the insulator which can be detected. In an embodiment, the voltage applied to the gates of transistors 11 and 12 is no less than a supply voltage applied to terminal 27. Thus, another advantage of contact structures 65 and 74 is facilitation of detecting defects that may be formed in the insulators.

From all the foregoing, one skilled in the art will understand that an example of an embodiment of a semiconductor device may comprise:

a semiconductor substrate, such as substrate 100, having a first conductivity type, such as for example P-type;

a first doped region, such as for example region 66, of a second conductivity type, such as for example N-type, formed on a surface of the semiconductor substrate, the first doped region having a periphery abutting the semiconductor substrate at a boundary (85) of the first doped region;

a first transistor, such as for example transistor 13, formed in the first doped region, the first transistor having a first doped polysilicon gate conductor, such as for example conductor 104, extending to overlie the boundary, such as for example boundary 85, the first doped polysilicon gate conductor having the first conductivity type;

a second transistor, such as for example transistor 14 formed in the semiconductor substrate, the second transistor having a second doped polysilicon gate conductor, such as for example conductor 114, extending to intersect the first doped polysilicon gate conductor, the second doped polysilicon gate conductor having the second conductivity type; and a gate contact having a contact conductor, such as for example conductor 110, formed on a first portion of the first doped polysilicon gate conductor and on a first portion of the second doped polysilicon gate conductor and overlying the boundary.

Another embodiment may include that the contact conductor has a first length that is greater than a first width of the contact conductor.

In another embodiment the first transistor may include a source contact having a source contact conductor, such as for example conductor 90, having a second width and a second length wherein the first length is greater than the second length and also greater than the second width.

Another embodiment may further include an insulator overlying a second portion of the first doped polysilicon gate conductor that overlies a channel region of the first transistor, and overlying a second portion of the second doped polysilicon gate conductor that overlies a channel region of the second transistor, the insulator having an opening overlying the first portion of the first doped polysilicon gate conductor, overlying the first portion of the second doped polysilicon gate conductor, and overlying the boundary.

In an embodiment the first doped polysilicon gate conductor and the second doped polysilicon gate conductor may extend to overlie the insulator and intersect with each other overlying the insulator.

An embodiment may include that the first doped polysilicon gate conductor and the second doped polysilicon gate conductor are substantially only doped polysilicon.

Another embodiment may include that the first and second doped polysilicon gate conductors substantially do not include a silicide or a salacide material.

The semiconductor device may have another embodiment wherein the second transistor is external to the first doped region.

An embodiment may further include a third transistor, such as for example transistor 11, formed in the first doped region, the third transistor having a third doped polysilicon gate conductor of the first conductivity type.

Another embodiment may also include a fourth transistor, such as for example transistor 12, formed in the semiconductor substrate and external to the first doped region, the fourth transistor having a fourth doped polysilicon gate conductor of the second conductivity type, the fourth doped polysilicon gate conductor extending to intersect the third doped polysilicon gate conductor.

Those skilled in the art will also understand that an example of an embodiment of a method of forming a semiconductor device may comprise:

forming a first doped region, such as for example region 66, of a first conductivity type, such as for example N-type, on a surface of a semiconductor substrate, such as for example substrate 100, of a second conductivity type, such as for example P-type;

forming a first active region such as for example channel region, of a first transistor, such as for example transistor 13, in the first doped region, the first active region having a first gate conductor, such as for example one of conductors 104 or 105, overlying a first channel region of the first transistor;

forming a second active region of a second transistor, such as for example transistor 14, in the semiconductor substrate and external to the first doped region, the second active region having a second gate conductor, such as for example one of conductors 114 are 115, overlying a second channel region of the second transistor;

extending the first gate conductor and the second gate conductor wherein one of the first gate conductor or the second gate conductor extends to overlie an interface between the semiconductor substrate and a periphery of the first doped region; and forming a gate contact conductor, such as for example conductor 110, on the first gate conductor, on the second gate conductor, and overlying the interface between the semiconductor substrate and the periphery of the first doped region.

Another embodiment of the method may also include forming the first gate conductor to be substantially only doped polysilicon.

An embodiment may also include forming the second gate conductor to be substantially only doped polysilicon.

The method may have an embodiment that may include forming the first gate conductor to have the second conductivity type and forming the second gate conductor to have the first conductivity type.

Another embodiment may also include forming an insulator on a portion of the first gate conductor that is overlying the first channel region and on a portion of the second gate conductor that is overlying the second channel region;

forming an opening in the insulator wherein the opening overlies the interface; and forming a metal conductor within the opening wherein the metal conductor physically and electrically contacts both the first gate conductor and the second gate conductor.

An embodiment may also include forming the gate contact conductor includes forming the gate contact conductor having a length that is greater than a width of the gate contact conductor.

In an embodiment, the method may include forming a source contact conductor contacting a source region of the first transistor wherein a length and a width of the source contact conductor is less than the length of the gate contact conductor.

The method may also include forming the gate contact conductor includes forming a metal on the first gate conductor and the second gate conductor.

Another embodiment may include forming a third transistor, such as for example transistor 11, in the first doped region, the third transistor having a source region that is common with the first transistor, and forming a fourth transistor in the semiconductor substrate and external to the first doped region wherein the fourth transistor has a source region that is common with the second transistor.

An embodiment may also include applying a voltage to the first gate conductor and to the second gate conductor wherein the voltage is greater than a power supply voltage applied to a source of the first transistor.

Those skilled in the art will also appreciate that an example of an embodiment of a semiconductor device may comprise:

a first doped region of a first conductivity type on a surface of a semiconductor substrate of a second conductivity type;

a first active region of a first transistor in the first doped region, the first active region having a first gate conductor overlying a first channel region of the first transistor;

a second active region of a second transistor in the semiconductor substrate and external to the first doped region, the second active region having a second gate conductor overlying a second channel region of the second transistor;

the first gate conductor and the second gate conductor disposed such that one of the first gate conductor or the second gate conductor extends to overlie an interface between the semiconductor substrate and a periphery of the first doped region; and a gate contact conductor disposed on the first gate conductor, on the second gate conductor, and overlying the interface between the semiconductor substrate and the periphery of the first doped region.

the first gate conductor including substantially only doped polysilicon.

Another embodiment may include the second gate conductor including substantially only doped polysilicon.

An embodiment may include the first gate conductor may have the second conductivity type and the second gate conductor having the first conductivity type.

In another embodiment the gate contact conductor may include an insulator on a portion of the first gate conductor that is overlying the first channel region and on a portion of the second gate conductor that is overlying the second channel region;

an opening in the insulator wherein the opening overlies the interface; and a metal conductor within the opening wherein the metal conductor physically and electrically contacts both the first gate conductor and the second gate conductor.

In another embodiment the gate contact conductor may have a length that is greater than a width of the gate contact conductor.

An embodiment may include a source contact conductor contacting a source region of the first transistor wherein a length and a width of the source contact conductor is less than the length of the gate contact conductor.

Another embodiment may include that the gate contact conductor may include a metal on the first gate conductor and the second gate conductor.

An embodiment may also include a third transistor in the first doped region, the third transistor having a source region that is common with the first transistor, and a fourth transistor disposed in the semiconductor substrate and external to the first doped region wherein the fourth transistor has a source region that is common with the second transistor.

An embodiment may include that a voltage may be applied to the first gate conductor and to the second gate conductor wherein the voltage is greater than a power supply voltage applied to a source of the first transistor or a drain of the second transistor.

In view of all of the above, it is evident that a novel device and method is disclosed. Included, among other features, is forming a gate conductor of a P-channel transistor to extend to at least overlie a well region boundary and to physically contact a gate conductor of an N-channel transistor. A contact structure is formed to include a conductor that physically contacts at least extensions of the two gate conductors which provides a more reliable connection and the redundant connection to the gate of the transistors. The gate conductor structures and the contact structure assist in reducing open connections to the gate of the transistor.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A semiconductor device comprising:
   a semiconductor substrate having a first conductivity type;
   a first doped region of a second conductivity type formed on a surface of the semiconductor substrate, the first doped region having a periphery with vertical sides abutting the semiconductor substrate at an outer boundary of the first doped region;
   a first transistor formed in the first doped region, the first transistor having a first doped polysilicon gate conductor extending to overlie the boundary, the first doped polysilicon gate conductor having the first conductivity type;
   a second transistor formed in the semiconductor substrate, the second transistor having a second doped polysilicon gate conductor extending to intersect the first doped polysilicon gate conductor, the second doped polysilicon gate conductor having the second conductivity type; and
   a gate contact having a contact conductor formed physically contacting a first portion of the first doped polysilicon gate conductor, extending to physically contact a first portion of the second doped polysilicon gate conductor and physically contacting the first portion of the first doped polysilicon gate conductor at the intersect with the first portion of the second doped polysilicon gate conductor wherein the intersect is overlying the outer boundary.

2. The semiconductor device of claim 1 wherein the contact conductor has a first length that is greater than a first width of the contact conductor.

3. The semiconductor device of claim 2 wherein the first transistor includes a source contact having a source contact conductor having a second width and a second length wherein the first length is greater than the second length and also greater than the second width.

4. The semiconductor device of claim 1 further including an insulator overlying a second portion of the first doped polysilicon gate conductor that overlies a channel region of the first transistor, and overlying a second portion of the second doped polysilicon gate conductor that overlies a channel region of the second transistor, the insulator having an opening overlying the first portion of the first doped polysilicon gate conductor, overlying the first portion of the second doped polysilicon gate conductor, and overlying the outer boundary.

5. The semiconductor device of claim 4 wherein the first doped polysilicon gate conductor and the second doped polysilicon gate conductor extend to overlie the insulator, and intersect with each other overlying the outer boundary.

6. The semiconductor device of claim 1 wherein the first doped polysilicon gate conductor and the second doped polysilicon gate conductor are substantially only doped polysilicon.

7. The semiconductor device of claim 1 wherein the first and second doped polysilicon gate conductors substantially do not include a silicide or a salacide material.

8. The semiconductor device of claim 1 wherein the second transistor is external to the first doped region.

9. The semiconductor device of claim 1 further including a third transistor formed in the first doped region, the third transistor having a third doped polysilicon gate conductor of the first conductivity type.

10. The semiconductor device of claim 9 further including a fourth transistor formed in the semiconductor substrate and external to the first doped region, the fourth transistor having a fourth doped polysilicon gate conductor of the second conductivity type, the fourth doped polysilicon gate conductor extending to intersect the third doped polysilicon gate conductor.

11. The semiconductor device of claim 1 wherein one of the first doped polysilicon gate conductor or the second doped polysilicon gate conductor extends to overlie an interface between the semiconductor substrate and the periphery with the vertical sides of the first doped region.

12. The semiconductor device of claim 1 wherein a P-N junction is formed at the intersect of the second doped polysilicon gate conductor and the first doped polysilicon gate conductor.

13. The semiconductor device of claim 12 wherein the gate contact conductor forms a short across the P-N junction.

* * * * *